(12) United States Patent
Xu et al.

(10) Patent No.: US 11,575,066 B2
(45) Date of Patent: Feb. 7, 2023

(54) N-ZNO/N-GAN/N-ZNO HETEROJUNCTION-BASED BIDIRECTIONAL ULTRAVIOLET LIGHT-EMITTING DIODE AND PREPARATION METHOD THEREFOR

(71) Applicant: SOUTHEAST UNIVERSITY, Nanjing (CN)

(72) Inventors: Chunxiang Xu, Nanjing (CN); Wei Liu, Nanjing (CN); Zengliang Shi, Nanjing (CN); Zhuxin Li, Nanjing (CN)

(73) Assignee: SOUTHEAST UNIVERSITY, Nanjing (CN)

( * ) Notice: Subject to any disclaimer, the term of this patent is extended or adjusted under 35 U.S.C. 154(b) by 0 days.

(21) Appl. No.: 17/606,221

(22) PCT Filed: May 29, 2019

(86) PCT No.: PCT/CN2019/089066
§ 371 (c)(1),
(2) Date: Oct. 25, 2021

(87) PCT Pub. No.: WO2020/215441
PCT Pub. Date: Oct. 29, 2020

(65) Prior Publication Data
US 2022/0158024 A1 May 19, 2022

(30) Foreign Application Priority Data
Apr. 25, 2019 (CN) .......................... 201910338046.7

(51) Int. Cl.
*H01L 33/00* (2010.01)
*H01L 21/66* (2006.01)
*H01L 33/56* (2010.01)

(52) U.S. Cl.
CPC .......... *H01L 33/0025* (2013.01); *H01L 22/14* (2013.01); *H01L 33/0029* (2013.01);
(Continued)

(58) Field of Classification Search
CPC ................................................... H01L 33/0083
See application file for complete search history.

(56) References Cited

U.S. PATENT DOCUMENTS

2005/0179052 A1* 8/2005 Yi ........................ H01L 29/0665
257/183
2007/0045660 A1 3/2007 Yi et al.

FOREIGN PATENT DOCUMENTS

| CN | 101710605 | 5/2010 |
|---|---|---|
| CN | 102570304 | 7/2012 |

(Continued)

*Primary Examiner* — Moazzam Hossain
*Assistant Examiner* — Hajar Kolahdouzan
(74) *Attorney, Agent, or Firm* — Treasure IP group, LLC

(57) ABSTRACT

The present invention discloses a bidirectional ultraviolet light emitting diode (UV LED) based on N—ZnO/N—GaN/N—ZnO heterojunction as well as its preparation method. The LED includes: N—ZnO microwires, a N—GaN film, a PMMA protective layer and alloy electrodes; and its preparation method includes the following steps: lay two N—ZnO microwires on the N—GaN film, then spin-coat a PMMA protective layer on the film to fix the N—ZnO microwires until the PMMA protective layer spreads over the N—ZnO microwires, and then place the film on a drying table to solidify the PMMA protective layer; then etch the PMMA protective layer with $O_2$ to expose the N—ZnO microwires, and prepare alloy electrodes on different N—ZnO microwires to construct a N—ZnO/N—GaN/N—ZnO heterojunction to constitute a complete device. The present invention constructs an N/N/N symmetrical structure; the device is (Continued)

Figure 1:
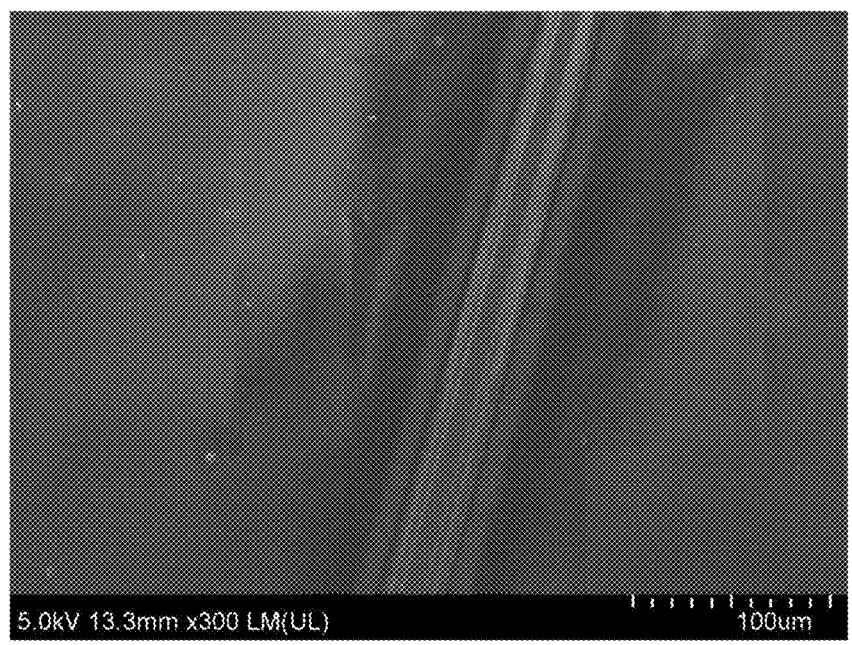

composed of N—ZnO and N—GaN, emits light in the ultraviolet region and has a small turn-on voltage.

6 Claims, 1 Drawing Sheet

(52) U.S. Cl.
CPC ...... *H01L 33/0075* (2013.01); *H01L 33/0083* (2013.01); *H01L 33/0095* (2013.01); *H01L 33/56* (2013.01); *H01L 2933/005* (2013.01)

(56) References Cited

FOREIGN PATENT DOCUMENTS

| | | |
|---|---|---|
| CN | 106449913 | 2/2017 |
| CN | 106684221 | 5/2017 |
| CN | 107634125 | 1/2018 |

\* cited by examiner

N-ZNO/N-GAN/N-ZNO HETEROJUNCTION-BASED BIDIRECTIONAL ULTRAVIOLET LIGHT-EMITTING DIODE AND PREPARATION METHOD THEREFOR

CROSS-REFERENCE TO RELATED APPLICATIONS

This Application is a Section 371 National Stage Application No. PCT/CN2019/089066, filed on May 29, 2019, and claims priority to Chinese Patent Application No. 2019103388046.7, filed on Apr. 25, 2019, the contents of which are incorporated herein by reference in their entireties.

TECHNICAL FIELD

The present invention relates to the technical field of semiconductor optoelectronic devices, especially a bidirectional ultraviolet light emitting diode (UV LED) having an N—ZnO/N—GaN/N—ZnO heterojunction as well as its preparation method.

BACKGROUND TECHNOLOGY

Zinc oxide has a high exciton binding energy of 60 meV and a wide direct band gap of 3.37 eV. It is a very promising semiconductor material for UV LED, especially laser LED. The p-type doped zinc oxide technology has developed rapidly in recent years, but there are still many difficulties in obtaining highly stable p-type zinc oxide. This hinders the development of zinc oxide-based UV LED and laser LED. In order to solve this problem, P—GaN is introduced to prepare zinc oxide-based UV LED and laser LED, but it still has many problems, such as low carrier concentration and high square resistance. In addition, the electrically pumped excitation spectrum of the N—ZnO/P—GaN heterojunction structure is mostly the visible light emission (~420 nm) related to defects in P—GaN, and the ultraviolet emission in N—ZnO is always suppressed. From the perspective of process and quality (carrier concentration, carrier mobility, and square resistance), N—GaN outperforms P—GaN, and its preparation process is simple.

The traditional lighting drive circuit is composed of a power factor correction circuit, an AC/DC converter circuit, and an output constant current circuit. If a bidirectional LED is used, only two circuits may be needed. However, the existing bidirectional LED structure has different emission wavelengths and different light intensities under forward bias and reverse bias. The light intensity and wavelength of the LED are the two main factors that affect strobe light, which is harmful to the eyes. Therefore, bidirectional LED now has few applications in the fields of lighting and display.

SUMMARY OF THE INVENTION

The solution provided by the present invention to the above technical problem is to provide a bidirectional UV LED having an N—ZnO/N—GaN/N—ZnO heterojunction as well as its preparation method. The present invention uses N—ZnO and N—GaN to construct a symmetrical structure, which has a high proportion of ultraviolet light emission, a low turn-on voltage, an unchanged total amount of light emitted under the forward and reverse bias and a little change in light emission wavelength. Such a structure can be used to prepare bidirectional LED for lighting and display applications.

To solve the above technical problem, the present invention provides a bidirectional UV LED having an N—ZnO/N—GaN/N—ZnO heterojunction, which comprises: which comprises: two N—ZnO microwires, a layer of N—GaN film, a PMMA protective layer and alloy electrodes; said bidirectional UV LED is prepared by the method of laying two N—ZnO microwires on the layer of N—GaN film, spin-coating a PMMA protective layer on the layer of N—GaN film to fix the two N—ZnO microwires, and then preparing alloy electrodes on the two N—ZnO microwires, respectively.

Preferably, the electron concentration of each N—ZnO micronwire is $10^{16}$-$10^{19}$/cm$^3$, and the electron mobility of each N—ZnO micronwire is 5-40 cm$^2$/V·s.

Preferably, the layer of N—GaN film is at 0.5-10 μm thick, its electron concentration is $10^{17}$-$10^{19}$/cm$^3$, and its electron mobility is 20-100 cm$^2$/V·s.

Preferably, the electrodes are all formed on the two N—ZnO microwires and are Ni/Au alloy electrodes or Ti/Au alloy electrodes.

Correspondingly, the preparation method of a bidirectional UV LED based on N—ZnO/N—GaN/N—ZnO heterojunction includes the following steps:

(1) Mixing and grinding ZnO powders, having a purity of 99.97-99.99%, and carbon powders, at a grade having diameter around 500 nm-2,000 nm, in a mass ratio of 1:1-1:1.3, forming a mixture and then transferring the mixture into a ceramic boat; cutting a silicon slice substrate into 3.2 cm×3 cm slices, then ultrasonically cleaning the silicon slices with a mixed solution of acetone and absolute ethanol and then drying the silicon slices with nitrogen; placing the silicon slices, as growth substrates, in a quartz tube having a length of 20 cm and a diameter of 8 cm with openings at both ends; cleaning sapphire slices, as growth substrates, and placing the sapphire slices in the quartz tube to be 10 cm away from an opening of the quartz tube; pushing the quartz tube horizontally into a tube furnace for a high temperature reaction, infused with 150 sccm argon gas and 15 sccm oxygen gas, to form a plurality of N—GaN microwires; and the substrate is composed of silicon slices or sapphire slices;

(2) Cleaning the N—GaN substrate by ultrasound with acetone, absolute ethanol and deionized water in sequence and then dried with nitrogen;

(3) Selecting two N—ZnO microwires from the reaction mixture in step (1), laying the two N—ZnO microwires on the layer of N—GaN film, then spin-coating a PMMA protective layer on to the layer of N—GaN film to fix the two N—ZnO microwires until the PMMA protective layer spreads over the two N—ZnO microwires, and then placing the layer of N—GaN film on a drying platform to solidify the PMMA protective layer; then etching the PMMA protective layer with O$_2$ to expose the N—ZnO microwires, and preparing alloy electrodes on the two N—ZnO microwires, respectively;

(4) Measuring electrical properties of the N—ZnO/N—GaN/N—ZnO heterojunction-based LED fabricated in Step (3) and measuring its electrically pumped luminescence spectrum.

Preferably, in Step (1), a temperature for high-temperature reaction is between 1,000-1,100° C., and a reaction undergoes time is between 90-180 minutes.

Preferably, in Step (3), the metal plating method is selected from magnetron sputtering, thermal evaporation and electron beam evaporation, and a plating thickness is between 20-60 nm.

The beneficial effects of the present invention are summarized below.

(1) The bidirectional UV LED disclosed uses two N—ZnO microwires and a layer of N—GaN film and has a high proportion of ultraviolet light emission and a low turn-on voltage.

(2) Said bidirectional UV LED has a symmetrical structure, emits the same amount of light under forward and reverse bias, has small and negligible change in the luminous wavelength, beneficial for lighting and display fields.

(3) The light-emitting wavelength of the N—ZnO/N—GaN/N—ZnO heterojunction-based LED disclosed by the present invention is 371 nm and 385 nm, the ultraviolet luminescence accounts for more than 80% of the total luminescence of said LED and said LED can work normally under an AC drive.

DESCRIPTION OF THE ACCOMPANYING DRAWINGS

FIG. 1 shows a scanning electron microscope image of the N—ZnO microrod synthesized in Embodiment 1 of the present invention after etching.

Figure 2:
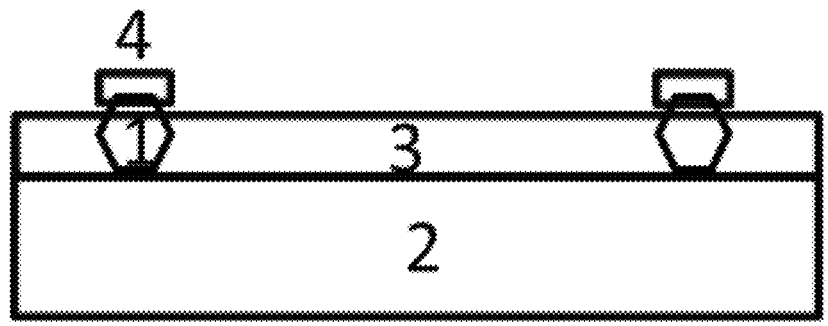

FIG. 2 shows a schematic diagram of the structure of N—ZnO/N—GaN/N—ZnO heterojunction-based LED disclosed in the present invention, wherein element 1 is an N—ZnO microwire; element 2 is an N-type GaN thin film; element 3 is a PMMA protective layer; and element 4 is an alloy electrode.

Figure 3:
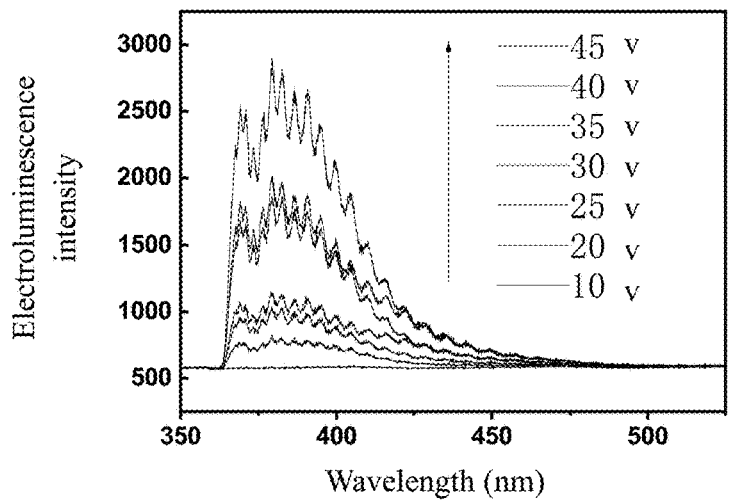

FIG. 3 shows the electroluminescence (EL) spectra of the N—ZnO/N—GaN/N—ZnO heterojunction-based LED synthesized in Embodiment 1 of the present invention under different injection AC voltages at room temperature.

DESCRIPTION OF EMBODIMENTS

As shown in FIG. 1 and FIG. 2, a bidirectional UV LED having an N—ZnO/N—GaN/N—ZnO heterojunction comprises: two N—ZnO microwires, a layer of N—GaN film, a PMMA protective layer and alloy electrodes; said UV LED having an N—ZnO/N—GaN/N—ZnO heterojunction is prepared by the method of laying two pieces of N—ZnO microwires on the layer of N—GaN film, spin-coating a PMMA protective layer on the layer of N—GaN film to fix the N—ZnO microwires, and then preparing alloy electrodes on the two N—ZnO microwires, respectively.

The electron concentration of each N—ZnO microwire is $10^{16}$-$10^{19}$/cm$^3$, and the electron mobility of each N—ZnO microwire is 5-40 cm$^2$/V·s. The N—GaN film has a thickness of 0.5-10 μm, with an electron concentration at $10^{17}$-$10^{19}$/cm$^3$, and electron mobility is at 20-100 cm$^2$/V·s. The electrodes are formed on the N—ZnO microwires and are Ni/Au alloy electrodes or Ti/Au alloy electrodes.

Correspondingly, the preparation method of a bidirectional UV LED based on N—ZnO/N—GaN/N—ZnO heterojunction includes the following steps:

(1) Mixing and grinding ZnO powders, having a purity of 99.97-99.99%, and carbon powders, at a grade having diameters around 500 nm-2,000 nm, in a mass ratio of 1:1-1:1.3, forming a mixture and then transferring the mixture into a ceramic boat; cutting a silicon slice substrate into 3.2 cm×3 cm slices, then ultrasonically cleaning the silicon slices with a mixed solution of acetone and absolute ethanol and then drying the silicon slices with nitrogen; placing the silicon slices, as growth substrates, in a quartz tube having a length of 20 cm and a diameter of 8 cm with openings at both ends; cleaning sapphire slices, as growth substrates, and placing the sapphire slices in the quartz tube to be 10 cm away from an opening of the quartz tube; pushing the quartz tube horizontally into a tube furnace for a high temperature reaction, infused with 150 sccm argon gas and 15 sccm oxygen gas, to form a plurality of N—GaN microwires; and the substrate is composed of silicon slices or sapphire slices;

(2) Cleaning the N—GaN substrate by ultrasound with acetone, absolute ethanol and deionized water in sequence and then dried with nitrogen;

(3) Selecting two N—ZnO microwires from the reaction mixture in step (1), laying the two N—ZnO microwires on the layer of N—GaN film, then spin-coating a PMMA protective layer on to the layer of N—GaN film to fix the two N—ZnO microwires until the PMMA protective layer spreads over the two N—ZnO microwires, and then placing the layer of N—GaN film on a drying platform to solidify the PMMA protective layer; then etching the PMMA protective layer with O$_2$ to expose the N—ZnO microwires, and preparing alloy electrodes on the two N—ZnO microwires, respectively;

(4) Measuring electrical properties of the N—ZnO/N—GaN/N—ZnO heterojunction-based LED fabricated in Step (3) and measuring its electrically pumped luminescence spectrum.

In Step (1), a temperature for high-temperature reaction is 1,000-1,100° C., and the reaction time is 90-180 minutes. In Step (3), the metal plating method is magnetron sputtering, thermal evaporation or electron beam evaporation, and the plating thickness is 20-60 nm.

Embodiment 1

(1) Mix and grind ZnO powders, having a purity of 99.99%, and carbon powders, a grade having diameters around 500 nm-2,000 nm, in a mass ratio of 1:1, form a mixture and then transfer the mixture into a ceramic boat; cut a silicon slice substrate into 3.2 cm×3 cm slices, then ultrasonically clean the silicon slices with a mixture solution of acetone and absolute ethanol and then dry the silicon slices with nitrogen; place the silicon slices, as growth substrates, in a quartz tube having a length of 20 cm and a diameter of 8 cm with openings at both ends; clean sapphire slices, as growth substrates, and place the sapphire slices in the quartz tube to be 10 cm away from an opening of the quartz tube; push the quartz tube horizontally into a tube furnace for a high temperature reaction, infused with 150 sccm argon gas and 15 sccm oxygen gas, to form a plurality of N—GaN microwires.

(2) After the reaction, the N—GaN substrate is ultrasonically cleaned with acetone, absolute ethanol and deionized water in sequence and then dried with nitrogen;

(3) Select two N—ZnO microwires from the reaction mixture in Step (1), lay the two N—ZnO microwires on the N—GaN film, then spin-coat a PMMA protective layer on the film to fix the two N—ZnO microwires until the PMMA protective layer spreads over the N—ZnO microwires, and then place the film on a drying table to solidify the PMMA protective layer; then etch the PMMA protective layer with O$_2$ to expose the N—ZnO microwires, and prepare alloy electrodes on the two N—ZnO microwires, respectively;

(4) Measure the electrical properties of the N—ZnO/N—GaN/N—ZnO heterojunction-based LED finally produced in Step (3), and measure its electrically pumped luminescence spectrum. Under different voltages at 100 Hz, the light-emitting wavelength positions of the LED are 371 nm and 385 nm, and the ultraviolet luminescence accounts for more than 85% of the total luminescence of the LED.

In Step (1), the temperature for high-temperature reaction is 1,000-1,100° C., and the above-mentioned reaction time is 120 minutes. In Step (3), the metal plating method is magnetron sputtering, thermal evaporation or electron beam evaporation, and the plating thickness is 45 nm.

FIG. 3 shows the electrically pumped luminescence spectrum of the N—ZnO/N—GaN/N—ZnO heterojunction-based LED synthesized in Embodiment case 1 under different AC voltages. The light-emitting wavelength positions of the LED are located at 371 nm and 385 nm and do not change with voltage.

The invention claimed is:

1. A bidirectional ultraviolet light emitting diode (UV LED) having an N—ZnO/N—GaN/N—ZnO heterojunction, comprising:
   two N—ZnO microwires, electron concentration of each of the two N—ZnO micronwires is $10^{16}$-$10^{19}$/cm$^3$, and electron mobility of each of the two N—ZnO micronwire is 5-40 cm$^2$/V·s,
   a layer of N—GaN film,
   a PMMA protective layer and alloy electrodes,
   wherein said N—ZnO/N—GaN/N—ZnO heterojunction is prepared by a method of
   laying two pieces of N—ZnO microwires on the layer of N—GaN film,
   spinning coating a PMMA protective layer on the layer of N—GaN film to fix the two N—ZnO microwires, and preparing alloy electrodes on the two N—ZnO microwires, respectively.

2. The bidirectional UV LED of claim 1, wherein the layer of N—GaN film has a thickness between 0.5-10 μm, having an electron concentration of $10^{17}$-$10^{19}$/cm$^3$, and an electron mobility at 20-100 cm$^2$/V·s.

3. The bidirectional UV LED of claim 1, wherein the electrodes are located on the two pieces of N—ZnO microwires and are Ni/Au alloy electrodes or Ti/Au alloy electrodes.

4. The preparation method of a bidirectional UV LED based on N—ZnO/N—GaN/N—ZnO heterojunction comprising:
   (1) mixing and grinding ZnO powders, having a purity of 99.97-99.99% and carbon powders, having diameters at 500 nm-2,000 nm, in a mass ratio of 1:1-1:1.3, forming a mixture and then transferring the mixture into a ceramic boat;
   cutting a silicon slice substrate into 3.2 cm×3 cm slices, then ultrasonically cleaning the silicon slices with a mixture solution of acetone and absolute ethanol and then drying the silicon slices with nitrogen;
   placing the silicon slices, as growth substrates, in a quartz tube, having a length of 20 cm and a diameter of 8 cm with openings at both ends;
   cleaning sapphire slices, as growth substrates, and placing sapphire slices in the quartz tube and is 10 cm away from an opening of the quartz tube;
   placing the quartz tube horizontally into a tube furnace for a high temperature reaction, infused with 150 sccm argon gas and 15 sccm oxygen gas to form a plurality of N—GaN microwires; the substrate is composed of silicon slices or sapphire slices;
   (2) cleaning the N—GaN substrate by ultrasound with acetone, absolute ethanol and deionized water in sequence and then drying the N—GaN substrate with nitrogen;
   (3) selecting two N—ZnO microwires from the plurality of N—GaN microwires in Step (1),
   laying the two N—ZnO microwires on the layer of N—GaN film,
   then spin-coating a PMMA protective layer on the layer of N—GaN film to fix the two N—ZnO microwires until the PMMA protective layer spreads over the two N—ZnO microwires, and
   then placing the film on a drying plateform to solidify the PMMA protective layer;
   then etching the PMMA protective layer with O$_2$ to expose the two N—ZnO microwires, and preparing alloy electrodes on the two N—ZnO microwires, respectively;
   (4) measuring electrical properties of the N—ZnO/N—GaN/N—ZnO heterojunction-based LED fabricated in Step (3), and measuring its electrically pumped luminescence spectrum.

5. The preparation method of a bidirectional UV LED based on N—ZnO/N—GaN/N—ZnO heterojunction of claim 4, wherein in Step (1), the high-temperature reaction is carried out between 1,000-1,100° C., at a reaction time between 90-180 minutes.

6. The preparation method of a bidirectional UV LED based on N—ZnO/N—GaN/N—ZnO heterojunction of claim 4, wherein in Step (3), the metal plating method is selected from magnetron sputtering, thermal evaporation and electron beam evaporation, and a plating thickness is between 20-60 nm.

* * * * *